(12) United States Patent
Liou et al.

(10) Patent No.: US 9,477,344 B2
(45) Date of Patent: Oct. 25, 2016

(54) PANEL

(71) Applicant: WINTEK CORPORATION, Taichung (TW)

(72) Inventors: Ying-Ting Liou, Hsinchu County (TW); Kai-Ting Tsai, Taichung (TW); Ming-Cheng Tsai, Changhua County (TW); Chun-Ming Huang, Taichung (TW)

(73) Assignee: WINTEK CORPORATION, Taichung (TW)

( * ) Notice: Subject to any disclaimer, the term of this patent is extended or adjusted under 35 U.S.C. 154(b) by 151 days.

(21) Appl. No.: 14/468,325

(22) Filed: Aug. 25, 2014

(65) Prior Publication Data

US 2015/0053461 A1  Feb. 26, 2015

(30) Foreign Application Priority Data

Aug. 26, 2013  (TW) .............................. 102215986 U

(51) Int. Cl.
*B32B 3/00* (2006.01)
*G06F 3/041* (2006.01)
*H05K 3/28* (2006.01)
*G02F 1/1345* (2006.01)

(52) U.S. Cl.
CPC ............ *G06F 3/0416* (2013.01); *G02F 1/1345* (2013.01); *G02F 2201/50* (2013.01); *H05K 3/28* (2013.01); *H05K 2201/10136* (2013.01)

(58) Field of Classification Search
CPC ............... G06F 3/0416; G02F 1/1345; G02F 1/136286; G02F 2201/50; H05K 3/28; H05K 2201/10136; Y10T 428/31504
See application file for complete search history.

(56) References Cited

U.S. PATENT DOCUMENTS

2015/0029684 A1* 1/2015 Park .................... H01L 27/1262
361/749

* cited by examiner

*Primary Examiner* — Elizabeth Mulvaney
(74) *Attorney, Agent, or Firm* — Ming Chow; Sinorica, LLC

(57) ABSTRACT

A panel including a substrate, a plurality of wirings and a protection stacked layer is provided. The substrate has a device area, a bonding area and a wiring area connected between the device area and the bonding area. The wirings extend from the device area to the bonding area through the wiring area. The protection stacked layer extends from a side of the wiring area adjacent to the device area towards a side of the bonding area and is located on the wirings.

9 Claims, 4 Drawing Sheets

PANEL

CROSS-REFERENCE TO RELATED APPLICATION

This application claims the priority benefit of Taiwan application serial no. 102215986, filed on Aug. 26, 2013. The entirety of the above-mentioned patent application is hereby incorporated by reference herein and made a part of this specification.

BACKGROUND OF THE INVENTION

1. Field of the Invention

The invention is related to a panel, more particularly to a panel provided with wiring protection design.

2. Description of Related Art

Generally speaking, a panel is divided into a device area and a wiring area. A plurality of wirings are disposed in the wiring area. The wirings are suitable for signal input and output. Since existing manufacturing processes of panels do not include protection design for wirings, the wirings are likely to be broken or scraped during the manufacturing process. Take display panels as an example, after an active device array substrate and a color filter substrate are assembled, a cutting process is usually performed to the color filter substrate. Since the active device array substrate is located under the color filter substrate, and there is no protection design for the wirings of the current active device array substrates in the corresponding cutting area, the wirings are likely to be scraped or pierced owing to uneven cutting stress or by the dusts generated during the cutting in the cutting process, which consequently causes the wirings to be broken. As a result, the display quality will be affected; meanwhile, the reliability of the display panel will be decreased as well.

In a known method for avoiding broken wirings, the cutting stress is reduced mainly by adjusting cutting parameters; however, the method has limited effects and is also time consuming. In another existing method, the cutting tools are switched to reduce the damage caused to the wirings. However, the method causes the manufacturing costs to be increased. In view of the foregoing, how to reduce occurrence of broken and scraped wirings with controlled manufacturing time and costs has become a trend in future development.

SUMMARY OF THE INVENTION

The invention provides a panel which may reduce occurrence of broken or scraped wirings.

In the invention, a panel includes a substrate, a plurality of wirings, and a protection stacked layer. The substrate has a device area, a bonding area, and a wiring area connected between the device area and the bonding area. The wirings extend from the device area to the bonding area through the wiring area. The protection stacked layer extends from a side of the wiring area adjacent to the device area towards a side of the bonding area and is located on the wirings.

Based on the above, in the invention, the panel is provided with a protection stacked layer disposed on the wirings, and the manufacturing process of the protection stacked layer is compatible with the existing manufacturing process of panels, which means that the protection stacked layer can be manufactured without using an additional processing apparatus or additional steps. Therefore, the invention may effectively reduce occurrence of broken or scraped wirings with controlled manufacturing time and costs.

In order to make the aforementioned features and advantages of the invention more comprehensible, embodiments accompanying figures are described in detail below.

DESCRIPTION OF EMBODIMENTS

Figure 1A:
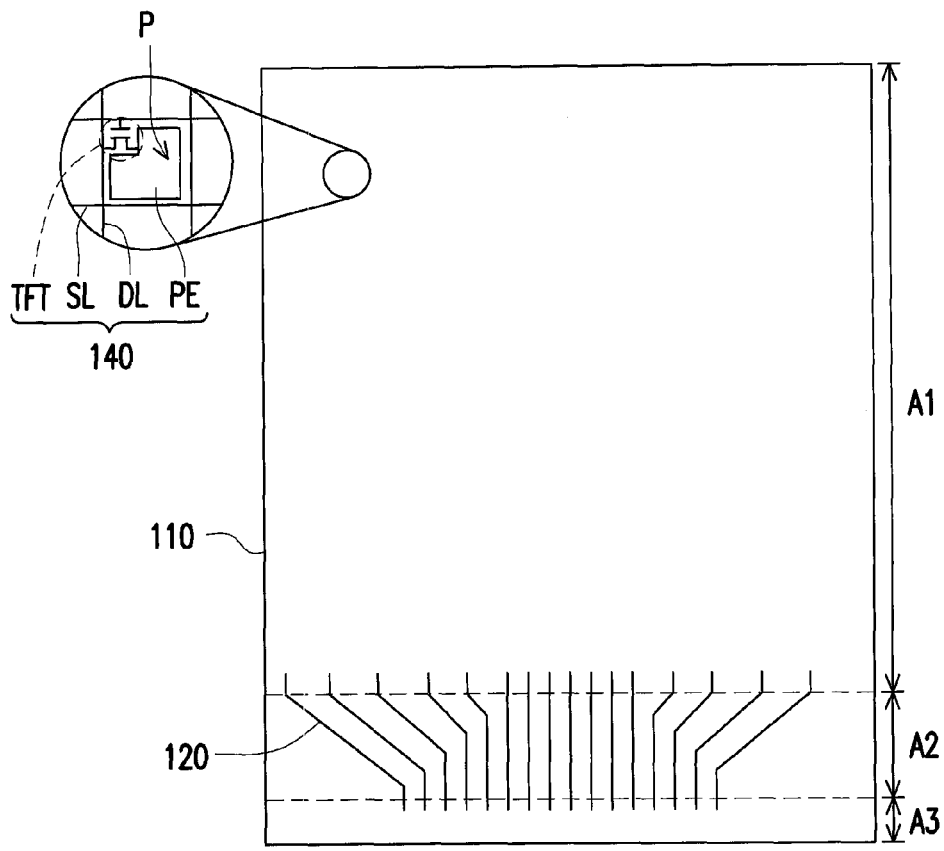
FIG. 1A is a top view illustrating a panel according to a first embodiment of the invention.
Figure 1B:
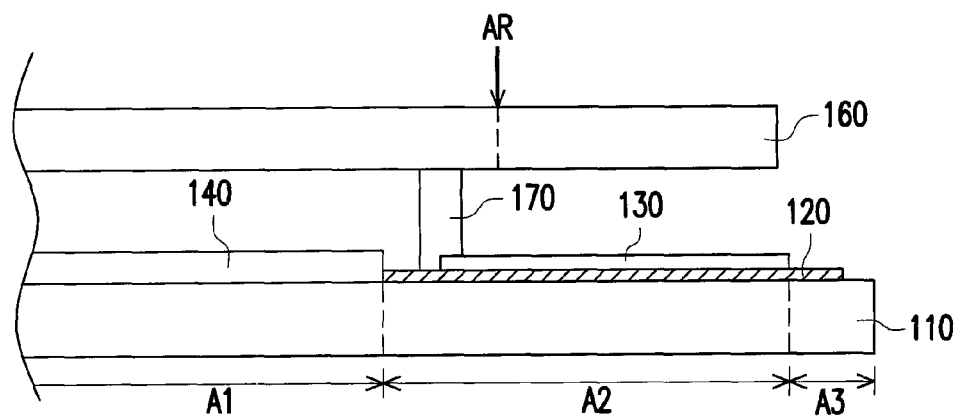
FIG. 1B is a local sectional view illustrating a panel according to the first embodiment of the invention.
Figure 1C:
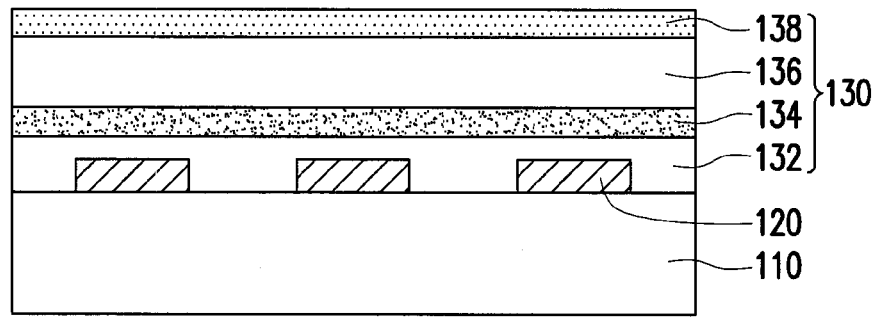
FIG. 1C is a sectional view illustrating wirings and a protection stacked layer in FIG. 1A.
Figure 1D:
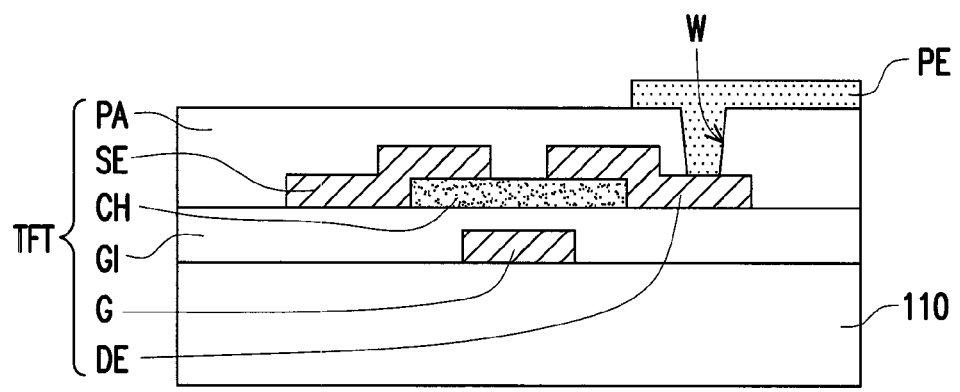
FIG. 1D is a sectional view illustrating an active device in FIG. 1A.

FIG. 1A is a top view illustrating a panel according to a first embodiment of the invention. FIG. 1B is a local sectional view illustrating a panel according to the first embodiment of the invention. FIG. 1C is a sectional view illustrating wirings 120 and a protection stacked layer 130 in FIG. 1A. FIG. 1D is a sectional view illustrating an active device in FIG. 1A. In order to show the wirings in FIG. 1A clearly, a film layer on the wirings are omitted in FIG. 1A. Please refer to FIG. 1A. In the embodiment, a panel 10 includes a substrate 110, a plurality of wirings 120, and a protection stacked layer 130, wherein the wirings 120 and the protection stacked layer 130 are disposed on the same surface of the substrate 110.

Specifically, the substrate 110 is, for example, a carrier which grows and carries a device, and the material thereof is, for example, glass, quartz, an organic polymer, or other suitable materials. In addition, the substrate 110 has a device area A1, a bonding area A3, and a wiring area A2 connected between the device area A1 and the bonding area A3.

The wirings 120 extend from the device area A1 to the bonding area A3 through the wiring area A2, which are, for example, used for transmitting/receiving a signal. Therefore, the material of the wirings 120 is, for example, metals, alloys, or a stacked layer thereof that has good conductivity.

The protection stacked layer 130 protects wirings 120 so as to reduce the occurrence of broken or scraped wirings. Therefore, the protection stacked layer 130 at least covers the area that is likely to be damaged during the manufacturing process. For example, as shown in FIG. 1B, in the embodiment, the panel 10 is, for example, a display panel. The substrate 110 is, for example, a substrate used as an active device array substrate. Moreover, the panel 10 may further include a plurality of devices 140 located within the device area A1. Generally speaking, after the active device array substrate is completed, that is, after the device 140 is completed on the substrate 110, it is required to assemble the active device array substrate and an opposite substrate 160 through a sealant 170, and to fill in a display medium (such as liquid crystal molecule) between the active device array substrate and the opposite substrate 160. In other words, the panel 10 may further include the opposite substrate 160 disposed to be opposite to the substrate 110, the sealant 170 located between the substrate 110 and the opposite substrate 160, and the display medium which is not shown, wherein the sealant 170 is disposed within the wiring area A2 and surrounds the device area A1. Meanwhile, a partial area of the wirings 120 within the wiring area A2 is located between the sealant 170 and the substrate 110. In the embodiment, the sealant 170, for example, covers an end of the protection stacked layer 130 adjacent to the device area A1, which should not be construed as a limitation to the invention. In other embodiments, it is possible that the protection stacked layer 130 and the sealant 170 do not overlap with each other; even a sidewall of the protection stacked layer 130 may be aligned with a sidewall of the sealant 170.

After the active device array substrate and the opposite substrate 160 are assembled, a cutting process AR needs to be performed to the opposite substrate 160 so as to complete the display panel. During the cutting process, a cutting area of the opposite substrate 160 generally corresponds to an external area of the sealant 170. Therefore, the protection stacked layer 130 should at least cover the area so as to reduce the occurrence of broken or scraped wirings 120 within the area. For example, the protection stacked layer 130, for example, extends from a side of the wiring area A2 adjacent to the device area A1 towards a side of the bonding area A3. In the embodiment, the protection stacked layer 130, for example, extends from the bottom of a side of the sealant 170 distant from the device area A1 towards an intersecting position of the wiring area A2 and the bonding area A3, which should not be construed as a limitation to the invention. In another embodiment, it is possible that the protection stacked layer 130 only covers the wirings 120 under the corresponding cutting area.

The protection stacked layer 130 may be a stacking layer of two layers or more. In the embodiment, as shown in FIG. 1C, the protection stacked layer 130, for example, includes a first layer 132, a second layer 134, a third layer 136, and a fourth layer 138, wherein the second layer 134 is located between the first layer 132 and the third layer 136, and the third layer 136 is located between the second layer 134 and the fourth layer 138.

The materials of the first layer 132, the second layer 134, the third layer 136, and the fourth layer 138 may be selected from of the materials of the device 140 within the device area A1. To be specific, the device 140, for example, includes a plurality of scan lines SL, a plurality of data lines DL, a plurality of active devices TFT, and a plurality of pixel electrodes PE, wherein the scan lines SL and the data lines DL respectively extend to the bonding area A3 through the wirings 120; the scan lines SL and the data lines DL are interlaced with each other so as to constitute pixel areas P distributed in arrays. The active device TFT is located within the pixel area P, and electrically connected to the scan lines SL, the data lines DL, and the pixel electrodes PE, respectively.

The active device TFT may be a bottom gate type or a top gate type active device. The following descriptions are provided using the bottom gate type active device as an example. Please refer to FIG. 1D. Each active device TFT includes, for example, a gate G, an insulating layer GI, a channel layer CH, a source SE, a drain DE, and a passivation layer PA. Specifically, in the embodiment, the gate G is disposed on the substrate 110, and the gate insulating layer GI covers the gate G and the substrate 110. The channel layer CH is disposed on the gate insulating layer GI and located over the gate G. The source SE and the drain DE are electrically insulated from each other, and respectively cover the channel layer CH, and located at two opposite sides of the channel layer CH. The passivation layer PA covers the source SE, the drain DE, the channel layer CH, and the gate insulating layer GI. In addition, the passivation layer PA has an aperture W to expose the drain DE, and the pixel electrode PE is electrically connected to the active device TFT through the aperture W. In addition, in some products designed with high aperture ratio, a padding layer (not shown) is further disposed between the passivation layer PA and the pixel electrodes PE. Moreover, the padding layer also has an aperture (not shown) exposing the drain DE corresponding to the aperture W of the passivation layer PA so that the pixel electrodes PE are electrically connected to the active device TFT through the aperture W of the passivation layer PA and the aperture of the padding layer.

Please refer to both FIGS. 1C and 1D. In the embodiment, the wirings 120 may be, for example, formed together with the gate G. The first layer 132 of the protection stacked layer 130, for example, may be formed together with the gate insulating layer GI. That is to say, the first layer 132 in the embodiment is, for example, an insulating layer, and the material thereof may be inorganic materials, organic materials, or a combination thereof, wherein the inorganic materials are, for example, silicon oxide, silicon nitride, silicon oxynitride, silicon-aluminum-oxide, or a stacking layer of at least two of the aforementioned materials.

In addition, in the embodiment, the second layer 134 may be, for example, formed together with the channel layer CH. That is to say, in the embodiment, the material of the second layer 134 may be determined depending on the material of the channel layer CH. For example, the second layer 134 may be a semiconductor layer, and the material thereof is, for example, a crystalline silicon semiconductor material, an amorphous-silicon semiconductor material, a poly-silicon semiconductor material, an oxide semiconductor material, and so on.

In addition, in the embodiment, the third layer 136 may be, for example, formed together with the passivation layer PA. That is to say, the material of the third layer 136 may be the inorganic material, organic material or a combination thereof listed above for the dielectric layer.

Moreover, in the embodiment, the fourth layer 138 may be, for example, formed together with the pixel electrodes PE. That is to say, in the embodiment, the fourth layer 138 is, for example, a metal oxide layer, and the material thereof may be indium tin oxide, indium zinc oxide, aluminum tin oxide, aluminum zinc oxide, indium gallium zinc oxide, or other suitable oxides, or a stacking layer of at least two of the aforementioned materials.

In another embodiment, in the aforementioned structure with high aperture ratio, the protection stacked layer 130 may further include a fifth layer, wherein the fifth layer may be, for example, formed together with the padding layer. That is to say, the material of the fifth layer may be the inorganic material, organic material or a combination thereof listed for the aforementioned dielectric layer.

In the embodiment, since the manufacturing process of the protection stacked layer 130 is compatible with the existing manufacturing process of panels, that is, in the embodiment, the protection stacked layer 130 can be manufactured without using an additional processing apparatus or additional steps, the panel 110 in the embodiment may effectively reduce the occurrence of broken or scraped wirings with controlled manufacturing time and costs.

It should be noted that, in the embodiment, although the stacking structure of the protection stacked layer 130 are exemplified as above, the invention is not limited thereto. In another embodiment, the stacking structure of stacking sequence of the protection stacked layer 130 may be determined depending on the device 140 within the device area A1. Additionally, in other embodiments, when the scan line SL and/or the data line DL extend to the wiring area A2, the protection stacked layer 130 may also cover thereon.

Figure 2A:
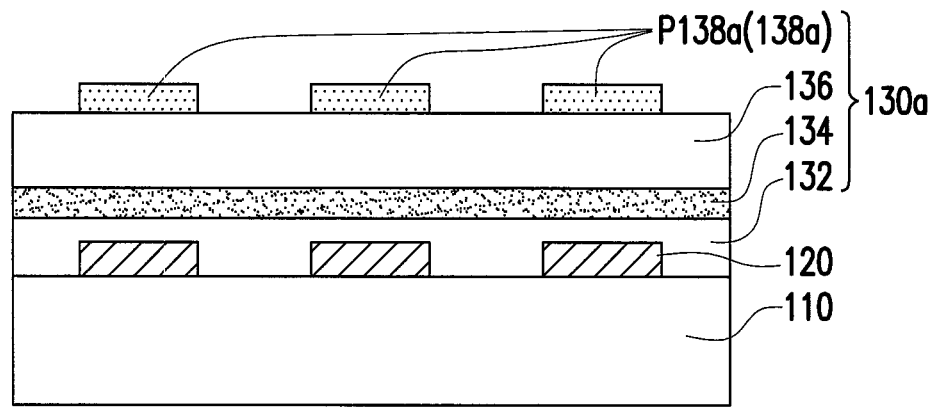
FIG. 2A is a sectional view illustrating a panel according to a second embodiment of the invention.
Figure 2B:
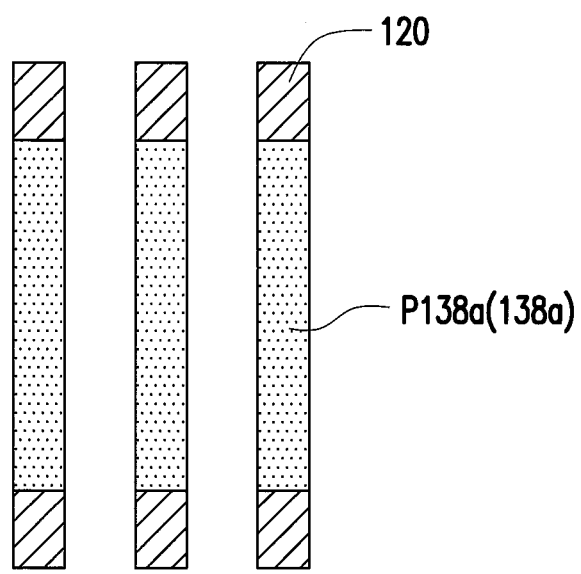
FIG. 2B is a top view of FIG. 2A.

FIG. 2A is a sectional view illustrating a panel according to a second embodiment of the invention. FIG. 2B is a top view of FIG. 2A, wherein the first layer 132, the second layer 134 and the third layer 136 in FIG. 2A are omitted in FIG. 2B. Please refer to FIGS. 2A and 2B. In the embodiment, the panel 11 and the panel 10 in FIG. 1B has an identical or similar film layer and effect, and the same devices are denoted by the same reference numbers; therefore, no further descriptions are incorporated herein. The main difference between the two lies in that the entire fourth layer 138 of the protection stacked layer 130 in FIG. 1B covers the wiring area A2. In the embodiment, the fourth layer 138a of the protection stacked layer 130a has a plurality of independent striped patterns P138a, and each striped pattern P138a is disposed in parallel over each wiring 120. Specifically, the orthogonal projection of each striped pattern P138a on the substrate 110 overlaps with the orthogonal projection of each wiring 120 on the substrate 110, and a sidewall of each striped pattern P138a is substantially aligned with a sidewall of each wiring 120.

Figure 3:
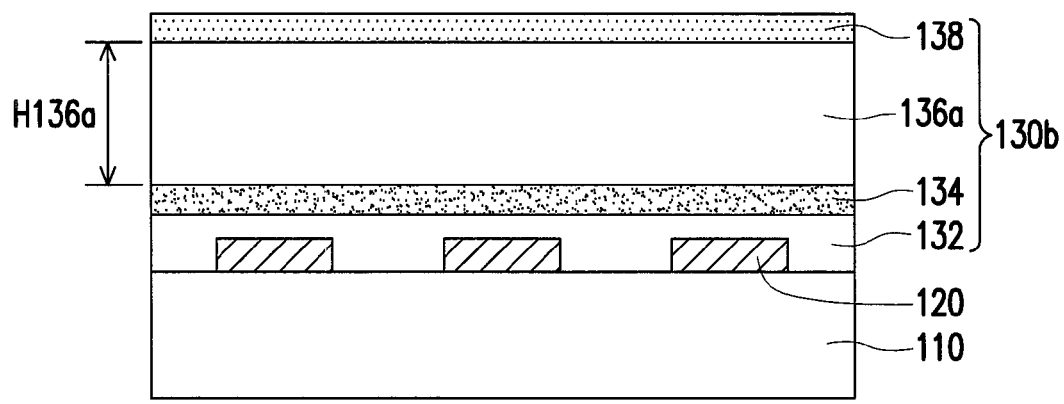
FIGS. 3 and 4 are sectional views illustrating panels according to a third embodiment and a fourth embodiment of the invention.
Figure 4:
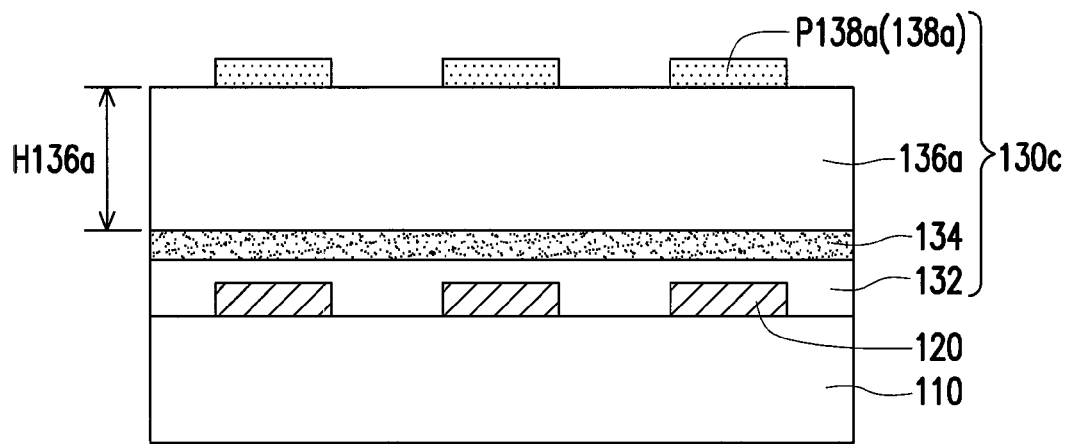

FIGS. 3 and 4 are sectional views illustrating panels according to a third embodiment and a fourth embodiment of the invention. Please refer to FIGS. 3 and 4. Panels 12 and 13 in the third and fourth embodiments respectively have an identical and similar film layer and effect as panels 10 and 11 in the first and second embodiments, and the same devices are denoted by the same reference numbers; therefore, no further descriptions are incorporated herein. The main difference lies in that the panels 12 and 13 in the third and fourth embodiments under the structure of panels 10 and 11 in the first and second embodiments, a thickness H136a of the third layer 136a is increased so as to further enhance the capability of the protection stacked layer 130b and the protection stacked layer 130c for avoiding broken or scraped wirings. For example, the thickness H136a of the third layer 136a is, for example, 3500 angstrom or more. In the embodiment, the thickness H136a of the third layer 136a is, for example, more than 3500 angstrom and less than or equal to 6000 angstrom.

In the actual measurement, all the display panels designed with the concepts described in the first to the fourth embodiments can pass reliability tests such as high temperature (such as 70° C.) test, high humidity (90%) test, or high temperature and high humidity test. Meanwhile, in practical applications, all the display panels can have a good display quality. Specifically, the crosstalk and vertical crosstalk of the display panels may be controlled to be within 2%; occurrence of flicker may be controlled to be about −25 dB; and color saturation as well as gamma curve maintains the display quality as general display panels.

Moreover, when a driving waveform signal of the scan line or a driving waveform signal of the data line is inputted into the wirings having the protection layer, the signal received by the wirings is the same as the driving waveform signal. That is, the signal received by the wirings is not distorted. In addition, the coupling effect between adjacent wirings should be less than 0.1 volt. That is to say, the configuration of the protection stacked layer does not have too much impact on signal output and input and the interference between two adjacent wirings. In other words, the aforementioned first to fourth embodiments may effectively reduce the occurrence of broken or scraped wrings while the display quality and driving quality are maintained at a certain level.

It should be noted that the aforementioned embodiments are listed as examples only, which should not construed as a limitation to the invention. In other embodiments, the number of the film layer stacked in the protection stacked layer and the stacking sequence or the thickness and shape of each film layer may be determined depending on design requirements. Moreover, the design concept of the protection stacked layer may not be restricted to be applied in the active device array substrate. The design concept of the protection stacked layer may be applied in all the panels provided with wirings or positions provided with wirings. For example, panels 10, 11, 12, and 13 may be a touch panel, and may further include a device 140, wherein the device 140 includes, for example, a plurality of touch devices, and the touch devices may be formed of a single-layered or multiple-layered transparent conductive layer (metal oxide), or formed of a signal-layered or multiple-layered metal mesh. Additionally, the protection stacked layers 130, 130a, 130b, and 130c, for example, extend from an intersecting position of the device area A1 and the wiring area A2 towards an interacting position of the wiring area A2 and the bonding area A3, and the protection stacked layers 130, 130a, 130b, and 130c may be formed of a metal oxide layer and at least one layer of dielectric layer (such as aforementioned the passivation layer or insulating layer).

In other practicable embodiments, the protection stacked layers 130, 130a, 130b, and 130c may be a double-layered stacking layer formed of one of the insulating layer and passivation layer collaborating with one of the semiconductor layer and metal oxide layer; alternatively, the protection stacked layers 130, 130a, 130b, and 130c may be a three-layered stacking layer selected from three of the insulating layer, the semiconductor layer, the passivation layer, the padding layer, and the metal oxide layer. For example, in the first to the fourth embodiments, the protection stacked layers 130, 130a, 130b, and 130c may omit the semiconductor layer or the metal oxide layer. In the embodiment where the semiconductor layer is omitted, the first layer may be, for example, the insulating layer; the second layer may be, for example, the passivation layer; the third layer may be, for example, the metal oxide layer, wherein the passivation layer may have a general thickness (as shown in FIGS. 1C and 2A) or greater thickness (as shown in FIGS. 3 and 4). Moreover, the pattern design of the metal oxide layer may adopt the pattern in either FIG. 1C or 2B. On the other hand, in the embodiment where the metal oxide layer is omitted, the first layer may be, for example, the insulating layer; the second layer may be, for example, the semiconductor layer; and the third layer may be, for example, the passivation layer. The passivation layer may have a general thickness (as shown in FIGS. 1B and 2A) or a greater thickness (as shown in FIGS. 3 and 4).

In summary, in the invention, the wirings are provided with the protection stacked layer, and the manufacturing process of protection stacked layer is compatible with existing manufacturing process of panels; that is, the protection stacked layer may be manufactured without using an additional processing apparatus or additional steps. Therefore, the invention may effectively reduce the occurrence of broken or scraped wirings with controlled manufacturing time and costs.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. A panel, comprising:
a substrate, having a device area, a bonding area, and a wiring area connected between the device area and the bonding area;
a plurality of wirings, extending from the device area to the bonding area through the wiring area;
a protection stacked layer, extending from a side of the wiring area adjacent to the
device area towards a side of the bonding area, and located on the wirings;
the protection stacked layer comprises at least two of an insulating layer, a semiconductor layer, a passivation layer, a padding layer, and a metal oxide layer; and
a thickness of the passivation layer is 3500 angstrom or more.

2. The panel according to claim 1, further comprising:
an opposite substrate, disposed to be opposite to the substrate; and
a sealant, located between the substrate and the opposite substrate, and disposed within the wiring area and surrounding the device area, wherein a partial area of the wirings within the wiring area is located between the sealant and the substrate.

3. The panel according to claim 2, wherein the protection stacked layer does not overlap with the sealant.

4. The panel according to claim 3, wherein a sidewall of the protection stacked layer is aligned with a sidewall of the sealant.

5. The panel according to claim 2, wherein the sealant covers an end of the protection stacked layer.

6. The panel according to claim 1, wherein the protection stacked layer covers from an intersecting position of the device area and the wiring area to an intersecting position of the wiring area and the bonding area.

7. The panel according to claim 1, wherein the metal oxide layer comprises a plurality of independent striped patterns, and each of the striped patterns is disposed in parallel over each of the wirings.

8. The panel according to claim 1, further comprising a plurality of devices disposed within the device area.

9. The panel according to claim 8, wherein the devices comprise a plurality of active devices or a plurality of touch devices.

* * * * *